United States Patent [19]
Wojewoda et al.

[11] Patent Number: 5,874,863
[45] Date of Patent: Feb. 23, 1999

[54] PHASE LOCKED LOOP WITH FAST START-UP CIRCUITRY

[75] Inventors: Igor Wojewoda, Phoenix; Jennifer Yuan Chiao, Chandler, both of Ariz.

[73] Assignee: Microchip Technology Incorporated, Chandler, Ariz.

[21] Appl. No.: 974,157

[22] Filed: Nov. 19, 1997

[51] Int. Cl.$^6$ .............. H03L 7/089; H03L 7/10; H03L 7/12; H03L 7/18
[52] U.S. Cl. ............... 331/17; 331/1 A; 331/4; 331/8; 331/25; 327/157
[58] Field of Search .................. 331/1 A, 4, 8, 331/16, 17, 25, DIG. 2; 327/105–107, 156–159

[56] References Cited

U.S. PATENT DOCUMENTS

| | | |
|---|---|---|
| 4,270,093 | 5/1981 | Miille . |
| 5,304,953 | 4/1994 | Heim et al. ........................ 331/1 A |
| 5,523,724 | 6/1996 | Assar et al. ....................... 331/1 A |
| 5,546,053 | 8/1996 | Ichimaru . |
| 5,548,249 | 8/1996 | Sumita et al. ..................... 331/1 A |
| 5,577,086 | 11/1996 | Fujimoto et al. . |
| 5,656,975 | 8/1997 | Imura . |
| 5,675,291 | 10/1997 | Sudjian . |

*Primary Examiner*—David Mis
*Attorney, Agent, or Firm*—Blank Rome Comisky & McCauley LLP

[57] ABSTRACT

A phase-locked loop (PLL) circuit has a phase comparator for comparing the phases of a local clock frequency and a reference frequency to generate a control signal indicative of a direction of adjustment of the local clock frequency for reducing the phase difference between the two frequencies. A voltage controlled oscillator (VCO) of the PLL responds to application of a control voltage thereto to generate an oscillation signal frequency from which the local clock frequency is derived. A loop filter responds to the control signal from the phase comparator to develop a control voltage for application to the VCO to adjust the local clock frequency in the direction indicated by the control signal to reduce the relative phase difference. The loop filter has a start-up circuit for detecting a selected edge of a cycle of the reference frequency after a predetermined number of cycles following commencement of operation or reset of the PLL circuit as being indicative of stabilization of the reference frequency, and is responsive to detection of such selected edge for promptly producing a linear boost of the control voltage from an initial level of substantially zero volts to a predetermined pull-up level exceeding the level of control voltage required to achieve phase locking. This reduces the time interval required to achieve phase locking, measured from the selected cycle edge. The loop filter is also responsive to the control voltage reaching the pull-up level to incrementally reduce the control voltage to the level required to achieve phase locking.

19 Claims, 3 Drawing Sheets

PHASE LOCKED LOOP WITH FAST START-UP CIRCUITRY

BACKGROUND OF THE INVENTION

The present invention relates generally to phase locked loop (PLL) circuits, and more particularly to improvements in start-up circuitry for phase locked loops.

In a typical prior art implementation, a PLL circuit (FIG. 1) includes a phase comparator 10 adapted to receive a reference clock input signal and a local clock signal at inputs 11 and 12, respectively. The phases of the two signals are compared and comparator 10 generates either a "too slow" signal (an "up" signal) or a "too fast" signal (a "down" signal) which is applied to the appropriate input 14 or 15, respectively, of a loop filter 16, depending on whether the local clock signal is lagging or leading the reference clock signal. The reference clock signal is also applied as a reference input 13 to the loop filter. The output voltage of the loop filter, which reflects whether the local clock is to be speeded up or slowed down, is applied to an input 18 of a voltage-controlled oscillator (VCO) 19. The loop filter 16 also assists in removing or reducing the higher frequency components and clock jitter otherwise attributable to oscillation of the local clock (about a selected point).

VCO 19 generates an oscillating output signal in the form of a sine wave with a frequency that depends on the output voltage of the loop filter. The output frequency of the VCO signal is adjusted upwardly or downwardly by appropriate adjustment of this control voltage, according to whether the local clock is too slow or too fast, respectively, relative to the reference clock. The VCO output may be supplied as a multiplied clock output 20, and may also subjected be to frequency division by divider 21 before being applied as the local clock signal to the phase comparator 10 on input 12. If the control signal produced by the phase comparator 10 indicates that the local clock is still not synchronized with a selected edge of the reference clock signal, the output frequency of the VCO is fine tuned accordingly, to provide the desired synchronization.

The time interval required for the PLL to lock the local clock in phase alignment with the reference frequency clock signal is the "lock time" or the "start time" or "start-up time" of the PLL. In conventional PLL circuits, lock time has typically run 60 or more milliseconds (msec). During the lock time of a semiconductor PLL chip, the chip is held in reset. A PLL with a highly stable output frequency usually has a very long lock time because correction (through the phase comparator, loop filter and VCO) is achieved in very small increments of upward or downward adjustment of the control voltage. If the lock time is sought to be decreased by using large increments of correction, instability is encountered characterized by undesirable rapid jitter about the proper lock point.

In co-pending application Ser. No. 08/779,907 of J. Chiao et al, commonly assigned herewith ("the '907 application"), a circuit is disclosed by which the lock time interval of the PLL is reduced to a much more manageable level, on the order of only microseconds ($\mu$sec). Rapid start-up is particularly desirable for PLL usage in a system that performs a control function, such as in a microcontroller unit. In the circuit of the '907 application, the PLL loop filter uses a preset reference voltage to cause an initial movement of the control voltage level to a value from which it is much more rapidly ramped up to the level necessary to achieve phase locking of the two input signal frequencies.

Thus, when the PLL operation is commenced, the control voltage increases not from an initial point of zero, but from the voltage level of the fixed reference or bias source. Accordingly, it is only necessary to overcome a relatively small voltage difference between the start-up level and the lock level. The reference voltage provides what is tantamount to a dynamic ground, and assures that the PLL will achieve a rapid lock, oscillating upwardly from a threshold voltage level to a point of stabilization at the desired frequency. This objective is attained without penalties of higher processing costs or greater consumption of silicon real estate. Despite this substantial improvement afforded by the circuit of the '907 application, it would be desirable to further reduce lock time.

It is a primary objective of the present invention to provide a PLL circuit that achieves an even faster lock without sacrificing stability.

SUMMARY OF THE INVENTION

In the system of the present invention, the control voltage to the VCO of the PLL circuit, which constitutes the loop filter output voltage, is initially at the level of electrical ground, but the level is rapidly increased according to the invention by charging a capacitor in the loop filter, using pull-up circuitry. A high level of control over the capacitor voltage is achieved, which is desirable to maintain stability and reduce jitter.

As before, stability generally demands only small adjustments of the control voltage, which could be accomplished by use of a large capacitor or a relatively small charging current. But again, small increments of correction increase lock time. According to an aspect of the invention, the process is enhanced and shortened by means of a start-up circuit that commences the capacitor charging only after a sufficient number of reference clock cycles following power-up or reset, to assure stable operation.

Once the start-up circuit is active, it activates a strong pull-up device to quickly charge the capacitor to a voltage level approximating that required to synchronize the phases of the local and reference clock signals. This control voltage is determined by pull-up/pull-down signals from the pull-up circuitry in the loop filter. When a pull-down signal is detected—indicative that the control voltage has overshot the final lock level—the start-up circuitry is turned off, and it remains off until another reset condition occurs. With start-up circuit off and the control voltage to the VCO close to the proper magnitude for phase-locking, fine tuning circuitry is used to finally adjust the voltage for a lock condition.

As contrasted with the invention of the '907 application, the present invention does not use a fixed reference voltage level as a built-in start-up point from which the control voltage level is ramped up to achieve locking, but rather, employs a self-timed start-up, and a control voltage for the VCO that literally leaps up to (and slightly above, i.e., overshoots) the voltage level required for final locking of phase/frequency of the reference and clock signals. The faster the reference frequency, the faster and higher is this jump in the control voltage to the VCO. Thereafter, the fine tuning feature can quickly adjust the voltage to the final lock level. An even faster lock is attained than with the circuit of the '607 application, in as little as 8 $\mu$sec for a preferred embodiment of the present invention.

According to the invention, a method of phase locking a locally-generated frequency with a reference frequency includes applying the two frequencies to a phase comparator to generate a control signal indicative of the lagging or leading characteristic of the phase of one relative to the other, and feeding back a control voltage derived from the control signal to null the lagging or leading characteristic. The reference frequency is allowed to stabilize after operation of the device is commenced, and the level of the control signal is then promptly boosted in a continuous linear increase (or decrease) from an initial reference level below (or above) a lock level at which the phase difference between the two frequencies is nulled, to a level exceeding (or falling below) the lock level, to reduce the time required to achieve phase-locking of the two frequencies. The stabilization of the reference frequency is indicated by a start-up circuit that detects a selected edge of the reference frequency a predetermined number of cycles after commencement of initial operation, and it is this indication that triggers boosting the control signal level.

The level of the control signal is incrementally adjusted toward the lock level immediately after reaching the level exceeding (or falling below) the lock level. The start-up circuit is turned off at the time of the first incremental adjustment of the control signal level toward the lock level after the level exceeding (or falling below) the lock level is reached, to eliminate any further influence of that circuit on the phase-locking method. But the start-up circuit is turned back on at each re-commencement of operation (or reset) of the device, to enable repeated detection of the selected edge of the reference frequency the predetermined number of cycles thereafter as the indicia of reference frequency stabilization.

BRIEF DESCRIPTION OF THE DRAWINGS

The above and still further aims, objects, aspects, features and attendant advantages of the present invention will become apparent from a consideration of the following detailed description of the best mode currently contemplated for practicing the invention, encompassed by certain preferred methods and embodiments, taken in conjunction with the accompanying drawings, in which.

DETAILED DESCRIPTION OF THE PREFERRED METHODS AND EMBODIMENTS

Figure 1:
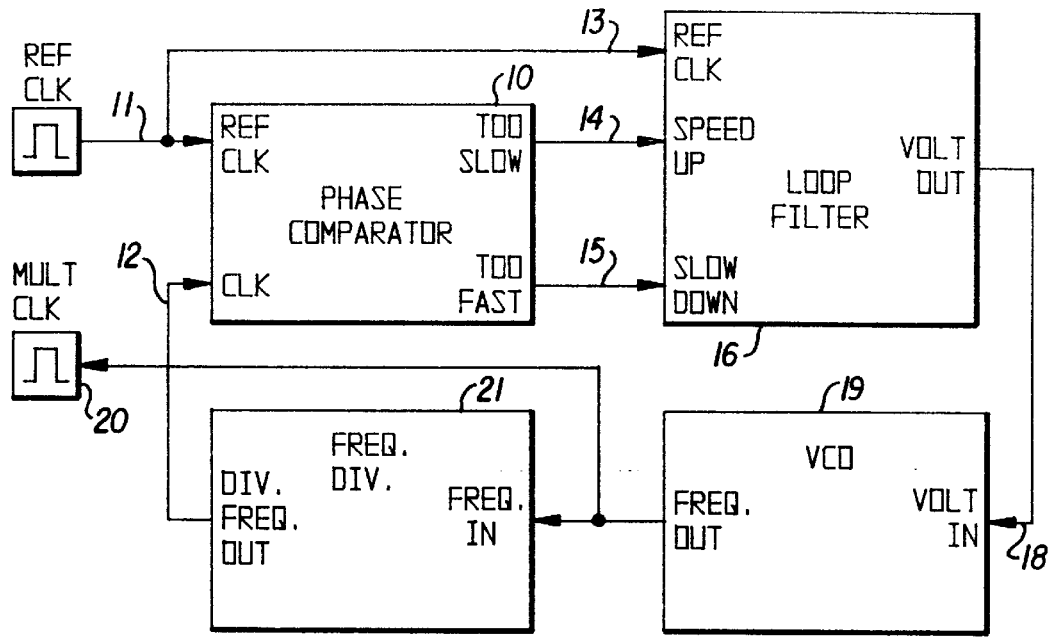
FIG. 1 is a block diagram of a typical configuration of a PLL system of the prior art, described in the above background section.
Figure 2:
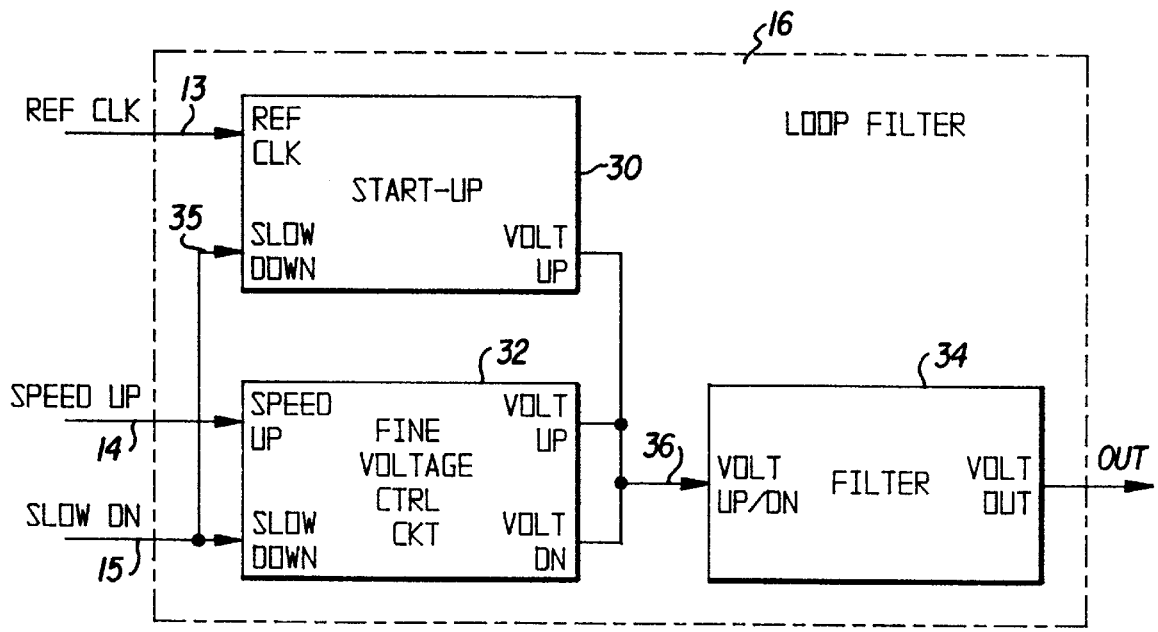
FIG. 2 is a simplified block diagram of a preferred embodiment of the loop filter circuit of the present invention.

The loop filter circuit 16 of the invention used in the PLL is shown in simplified block diagrammatic form in FIG. 2. It includes a start-up circuit 30, a fine voltage control circuit 32, and a filter circuit 34. The reference clock frequency on input 13 to the loop filter is applied to the start-up circuit. The "speed up" and "slow down" signals applied to the fine voltage control circuit 32 at inputs 14 and 15, respectively, are derived from the phase comparator 10 (FIG. 1) based on its comparison of the phase of the local clock signal frequency relative to phase of the reference signal frequency. The "slow down" signal, if generated by the phase comparator (as the "too fast" output of FIG. 1 indicating that the phase of the local clock signal frequency is leading the reference signal frequency) is also applied to the start-up circuit 30 at input 35. Finally, the applicable output(s) of start-up circuit 30 and fine voltage control circuit 32 are applied to an input 36 of filter circuit 34 to clean up the control signal voltage to the VCO (e.g., 19 of FIG. 1) and deliver it on input 18 of FIG. 1.

In the prior art, the use of a special start-up circuit has depended on the particular design and application under consideration, and is not typical of PLLs. The start-up circuit 30 of the present invention operates on a self-timed basis. A comparison to the operation of the PLL of the '907 application is illustrated in the waveform plots of FIG. 4, to be discussed presently. Additionally, in the circuit of the '907 application, certain aspects of the start-up mode are continuously present in the overall circuit. For example, a diode drop associated with the fixed reference threshold voltage of that circuit is always present in the system, which establishes a minimum voltage throughout the overall circuit operation. By contrast, the functions and effect of the start-up circuit used in the present invention are observed only at or during start up. Once the start-up condition is fulfilled, the start-up circuit becomes completely transparent, with no residual effect in the operation of the PLL.

Figure 3:
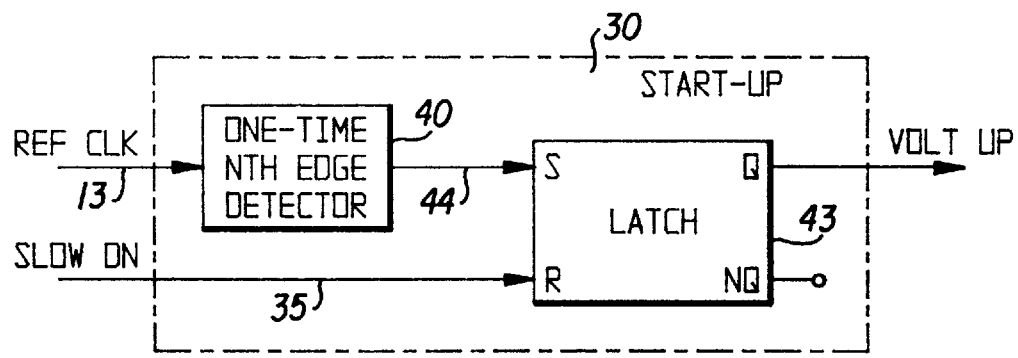
FIG. 3 is a simplified block diagram of a start-up circuit employed in the loop filter circuit of FIG. 2.

A simplified block diagram of start-up circuit 30 is shown in FIG. 3. Basically, the circuit includes a one-time edge detector 40 and a latch circuit 43. The reference clock is applied to the edge detector at input 13 and the "slow down" command signal is applied at input 35 to the reset the latch circuit. The "set" input of the latch is obtained from the output of the edge detector at input 44. Edge detector 40 is implemented to locate a predetermined edge of the reference clock, which could be any edge—the eighth edge, the 100th edge, or something else, the selection of which will depend heavily on the system application. For the sake of example in the preferred embodiment of the invention, however, the reference clock input is monitored and the edge detector is triggered to generate a set signal at the fourth edge of the clock, and specifically at the rising edge of the fourth cycle. Detection of this designated edge is predicated on the number of ripple cells in the detection circuit, which may use a modular 8 counter.

Selection of the rising edge of the fourth cycle allows start-up and phase locking to be attained relatively quickly, within constraints of desired stability of operation. Also, the number of ripple cells or latches required for detection increases as the number of clock cycles to be detected increases. Hence, detection of and triggering start-up after the occurrence of only a few clock cycles reduces circuit complexity, and with it, lessens the die area required to be occupied by the circuit on the semiconductor integrated circuit chip in which it is fabricated.

Clock stability and associated presence or absence of noise must be considered in determining what constitutes a necessary and sufficient amount of edge counting in the clock signal. Typically, the input reference clock signal to the PLL is obtained from an external crystal oscillator which does not oscillate well at power-up. Filtering the ripples promotes faster attainment of stability and makes less edge counting necessary. In those circumstances, noise on the clock signal in the first few cycles is of little concern since it can be eliminated thereafter. If the reference clock signal is internally generated, the number of stages involved is normally sufficient to clean up the clock signal within four cycles. However, depending on specific oscillator selection, e.g., external clock mode or low frequency mode, it may be desirable to designate more than four cycles to initiate start-up.

Upon achieving start-up, the primary function of loop filter 16 (FIG. 2) is to null the "speed up" and "slow down" signals from the comparator at inputs 14 and 15 by appropriately adjusting the output control voltage to the VCO at 18. Once the normal locked or "steady-state" operation of the PLL is reached, the loop filter need only make slight adjustments to take care of subtle changes in local clock frequency/phase by means of the fine voltage control circuit 32. The smaller the incremental changes in magnitude of the control voltage to the VCO, the greater is the control exercised over the frequency and phase of oscillation of the local clock signal. Large frequent overshoots or undershoots of the correct clock frequency are to be avoided, so that a stream of data can be observed with frequency stability and low jitter virtually from the outset of operation.

The problem encountered at start-up, however, is how to achieve a fast reduction of the delta that exists between the level of the control voltage to the VCO at start-up and the control voltage required for final phase lock. If that difference were, say, two volts, adjustments that are typically limited to the millivolt range by the fine voltage control circuit would result in an unacceptably long time interval for locking. Referring to the plot of control voltage versus time in FIG. 4, in the circuit operation described in the '907 application, which is incorporated by reference herein in its entirety, a waveform 50 is obtained (shown as a dashed line). Commencing with an origin at which the reference clock has stabilized, waveform 50 undergoes an almost vertical jump 51 to the value of the fixed reference voltage (for example, 1 volt) in the loop filter.

At that point, the waveform is ramped up fairly rapidly along 52 to the final lock level 53. In practice, this lock time, tlock1, is achieved in approximately 100 μsecs, and some slight oscillation of the waveform takes place initially at the lock level 53 owing to overshoot and adjustments of the control voltage by the fine control voltage circuit.

Figure 4:
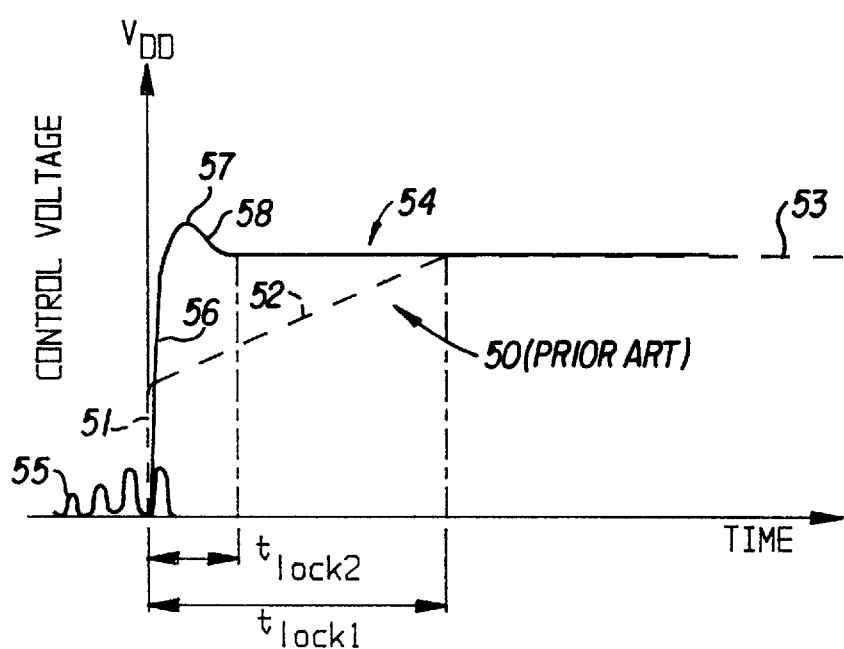
FIG. 4 is a waveform plot indicative of the timing of the start-up circuit and relative development of an approximate control voltage for application to the VCO, with an overlay plot of the exemplary relative time for achievement of a phase lock with the circuit of the '907 application.

Operation of the loop filter circuit of the present invention is also shown on the chart of FIG. 4, as the plot of a waveform 54 (shown as a solid line) which also commences at the origin, but in this case at the rising edge of the fourth cycle of the reference clock signal 55. This waveform, at start-up, immediately undergoes a jump 56 in which it overshoots the final lock level 53 at 57 and then is reduced in magnitude along 58 by the pull-down operation of the loop circuit and ultimately the operation of the fine voltage control circuit 32 (FIG. 2), to the lock level. At the beginning of the pull-down portion of the waveform just as it drops below its peak at 57, the start-up circuit is turned off and becomes transparent to loop circuit and PLL circuit operation, until the next reset. In computer simulations of the PLL circuit of the present invention, the loop filter circuit was found to produce tlock2 in considerably less time than that achieved for the waveform 50, which itself provides a lock time much shorter than other prior art circuits.

In a PLL circuit using the loop filter circuit of FIG. 2, a "too fast" ("slow down") signal is generated by the phase comparator when an overshoot occurs and throughout the time that elapses until the control voltage level is brought to or below the final lock level. A slight overshoot is desirable to enable incremental downward adjustment by fine voltage control circuit 32, and to make the system behavior more predictable. The rapid start-up and phase locking achieved with the circuitry of the present invention is of considerable importance in frequency sensitive applications, such as where it is desired is to transmit a specific baud rate. In such situations, the frequency should be stable before transmission is initiated, or possibly slower bit rates can result in erroneous messages or missing bits in the transmitted data.

When the first "slow down" signal is received from the phase comparator, it is applied at input 35 to reset the latch circuit 43 (FIG. 3) and thereby disables the start-up circuit 30, which is then transparent to further circuit operation. Hence, it does not contribute to further adjustments of the control voltage to the VCO, adjustments of the clock frequency or phase, or other operation. As long as the PLL circuit is operated within its performance specifications, an overshoot of the lock level will always occur right after start-up to turn off the start-up circuit.

Each time the chip is reset, the reset signal is applied to the loop filter circuit, thereby returning the circuitry to point zero and restarting the entire process. The reference clock frequency is monitored once again by edge detector 40 to set latch 43 of start-up circuit 30 on the fourth clock edge, which initiates pull-up of the control voltage applied by the loop filter circuit to the VCO. The start-up circuit will be disabled again at the first "slow down" signal following overshoot.

Figure 5:
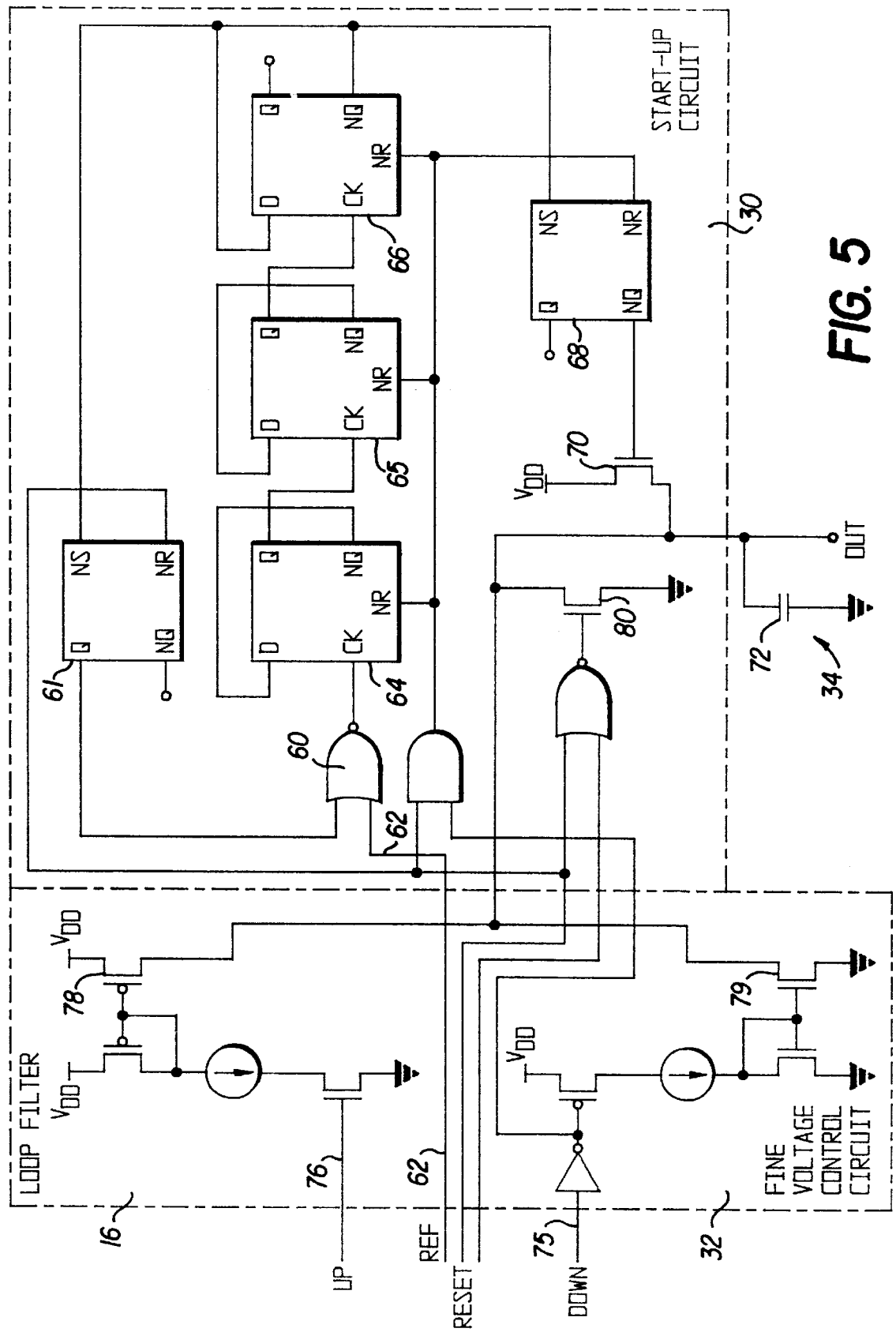
FIG. 5 is a more detailed schematic circuit diagram of the loop filter circuit of FIG. 2.

A more detailed schematic circuit diagram of the presently preferred embodiment of loop filter circuit 16 is illustrated in FIG. 5. Start-up circuit 30, fine voltage control circuit 32, and filter 34 are delineated within respective dashed line enclosures.

The one-time nth edge detector 40 of start-up circuit 30 comprises a plurality of latches 64, 65, 66, configured as a modular 8 counter that counts edges of the reference clock signal on input 62. In operation of the start-up circuit, when the chip is reset, the PLL circuit is disabled and all of the latches of the start-up circuit are reset to zero, including flip-flop 61. Gate 60 is cleared (i.e., enabled) by the concurrent presence of an output signal from flip-flop 61 and the reference clock signal at 62. The start-up circuit 30 then commences to count edges of the incoming reference clock signal at input 62 which has been allowed to pass through gate 60, by propagation of the reference clock through the ripple cells (latches) 64, 65, 66 of the modular 8 counter. By virtue of inversion provided by gate 60, the rising edge of the fourth full reference clock cycle is detected, as counted by the ripple cells, to cause a latch 68 to be set. When that occurs, start-up is initiated to launch the PLL circuit phase locking process by turning on device 70 and rapidly charging up capacitor 72.

More specifically, by setting latch 68, a pull-up device comprising PMOS transistor 70 is enabled, and one shot flip-flop 61 is set, thereby removing the signal from gate 60 so that the reference clock can no longer pass through the gate. Thus, all of the ripple cells 64, 65, and 66 are effectively disabled to prevent them from being clocked again until the next reset. Enabling pull-up device 70 results in a rapid increase in the control voltage by the fast charging of capacitor 72 in the filter 34. If the pull-up device is left on, the control voltage to the VCO at the output of the filter will continue to rise until it reaches the supply voltage VDD, to which the pull-up transistor is tied. Therefore, it is desirable and necessary to cut off this output voltage at the proper time, which occurs when the "slow down" signal goes active at input 75. The latter signal is applied to both the start-up circuit and the fine voltage control circuit 32. This disables the start-up circuit, and consequently all of its ripple cells are reset. Concurrently therewith, the enable-disable latch 68 is reset and pull-up device 70 is turned off.

As a consequence, the pull-up of the control voltage ceases at that time, capacitor 72 retains its charge level, and it remains to incrementally adjust the control voltage through the operation of fine voltage control circuit 32.

Circuit 32 continues to operate in response to the "slow down" and "speed up" command or indication signals from the phase comparator on inputs 75 and 76, respectively. These rapidly culminate in achieving the proper control voltage level to the VCO, and the phase locking of the local and reference clock frequencies. The voltage up response of the fine voltage control circuit is controlled by PMOS device 78 and the voltage down response is controlled by NMOS device 79. Devices 78 and 79 are of approximately equal size but about an order of magnitude smaller than pull-up device 70. The respective bias currents therethrough are set to lie in a range from about ⅒th to about ¹⁄₁₀₀th of the maximum current through pull-up device 70, and the resulting voltages across capacitor 72 serve to incrementally charge and discharge it to achieve the final lock level of the control voltage. Another NMOS transistor 80 is used to discharge capacitor 72 to ground when the PLL circuit is reset, in preparation for a new cycle of the phase locking process upon start-up.

Although a best mode currently contemplated for practicing the invention has been described herein, it will be recognized by those skilled in the art of the invention that variations and modifications of the disclosed methods and embodiments may be made without departing from the true spirit and scope of the invention.

For example, the principles of the invention may be embodied in a reversal of the preferred embodiment, in which, rather than boosting the control voltage from zero or ground potential (or $V_{ss}$) to a level exceeding the final lock level and then disabling the start-up circuit upon receipt of a "too fast" ("slow down") signal, the control voltage undergoes a rapid drop from $V_{DD}$ to a level below (i.e., less positive (or more negative) than) the final lock level (an undershoot of that level) and the start-up circuit is then disabled upon receipt of a "too slow" ("speed up") signal. The drop in voltage level is accomplished by a pull-down circuit that substantially mirrors the pull-up circuit of the preferred embodiment. Incremental adjustments would be carried out in the same manner as described above except that the initial adjustments would be made to increase the control voltage to bring it back to the final lock level from the undershoot level.

Accordingly, it is intended that the invention shall be limited only by the appended claims and the rules and principles of the applicable law.

What is claimed is:

1. A device-implemented method of phase locking a locally-generated frequency with a reference frequency, which comprises the steps of applying the local frequency and the reference frequency to a phase comparator to generate a control signal indicative of the lagging or leading characteristic of the phase of one of said frequencies relative to the other, and using the control signal or a derivative thereof as a feedback signal to null said lagging or leading characteristic of the phase so as to bring the phases of the two frequencies into alignment, said method further including the steps of allowing the reference frequency to stabilize after the device commences initial operation and thereupon promptly boosting the level of the control signal in a continuous linear increase or decrease from an initial reference level below or above a lock level at which the phase difference between the two frequencies is nulled, to a level exceeding or falling below the lock level, respectively, to reduce the time required to achieve phase-locking of the two frequencies.

2. The device-implemented method of claim 1, further including incrementally adjusting the level of said control signal toward said lock level immediately after reaching said level exceeding or falling below the lock level.

3. The device-implemented method of claim 2, wherein the step of allowing the reference frequency to stabilize after the device commences initial operation includes employing a start-up circuit to detect a selected edge of the reference frequency a predetermined number of cycles after said commencement of initial operation as indicative of stabilization, and, upon such detection, triggering the step of promptly boosting the level of the control signal.

4. The device-implemented method of claim 3, further including turning off the start-up circuit immediately upon the first incremental adjustment of the level of said control signal toward said lock level after reaching said level exceeding or falling below the lock level.

5. The device-implemented method of claim 4, including turning the start-up circuit back on upon each re-commencement of operation of the device, to enable the start-up circuit to again detect said selected edge of the reference frequency a predetermined number of cycles after each such re-commencement of operation as indicative of stabilization of the reference frequency, and, upon each such detection, triggering the step of promptly boosting the level of the control signal to a level exceeding or falling below the lock level.

6. For use with a device for phase locking a locally-generated frequency to a reference frequency, in which a voltage controlled oscillator (VCO) generates a local frequency as a multiple of a predetermined reference frequency, said VCO being responsive to variation of the level of a control voltage to correspondingly vary the phase of the local frequency relative to the phase of the reference frequency; a phase comparator responsive to the local frequency and the reference frequency for comparison of the relative phases thereof to generate a control signal indicative of the lagging or leading characteristic of the phase of the local frequency relative to the phase of the reference frequency; a voltage generator responsive to said control signal for deriving therefrom a control voltage having a level representative of the phase relationship between the local frequency and said reference frequency; and means for applying the control voltage generated by said voltage generator to the VCO to reduce the lagging or leading characteristic of the phase of the local frequency relative to the phase of the reference frequency indicated by the control signal and thereby correspondingly reduce the phase difference between the two frequencies, whereby to ultimately null said phase difference; an improvement comprising:

means responsive to stabilization of the reference frequency after the device commences initial operation for thereupon promptly boosting the level of the control voltage in a continuous linear increase or decrease from an initial reference level below or above a lock level at which the phase difference between the two frequencies is nulled, to a level exceeding or falling below the lock level, respectively, to reduce the time required to achieve phase-locking of the two frequencies.

7. The improvement of claim 6, further including:

means responsive to said control voltage reaching said level exceeding or falling below the lock level for immediately thereafter incrementally adjusting the level of said control voltage toward said lock level.

8. The improvement of claim 6, further including:

a start-up circuit for detecting a selected edge of the reference frequency a predetermined number of cycles after said device commences initial operation as being indicative of stabilization of the reference frequency, and wherein said means for thereupon promptly boosting the level of the control voltage includes means responsive to such detection for triggering such boost.

9. The improvement of claim 8, further including:

means responsive to said control voltage reaching said respective level exceeding or falling below the lock level for immediately thereafter incrementally adjusting the level of said control voltage toward said lock level, and means for turning off the start-up circuit immediately upon the first incremental adjustment of the level of said control signal toward said lock level after reaching said respective level exceeding or falling below the lock level.

10. The improvement of claim 9, including:

means for turning the start-up circuit back on upon each re-commencement of operation of the device, to enable the start-up circuit to again detect said selected edge of the reference frequency the predetermined number of cycles after each re-commencement of operation as indicative of stabilization of the reference frequency, and wherein said means responsive to such detection for triggering the prompt boost is responsive to each such detection to perform the triggering.

11. The improvement of claim 8, including:

means responsive to said control voltage reaching said respective level exceeding or falling below the lock level for thereupon turning off the start-up circuit.

12. The improvement of claim 8, wherein said predetermined number of cycles is within the first four cycles after said device commences or re-commences operation.

13. A phase-locked loop (PLL) circuit chip for synchronizing the phases of a local clock frequency and a reference frequency, comprising:

a phase comparator for comparing the phases of the local clock frequency and the reference frequency to generate a control signal indicative of a direction of adjustment of the local clock frequency for reducing any relative phase difference and thereby ultimately phase locking the local clock frequency to the reference frequency, a voltage controlled oscillator (VCO) responsive to a control voltage applied thereto to generate an oscillation signal frequency from which the local clock frequency is derived, and a loop filter responsive to the control signal from said phase comparator for developing a control voltage for application to the VCO to adjust the local clock frequency in the direction indicated by the control signal for said reduction of relative phase difference, the loop filter including a start-up circuit for detecting a selected edge of a predetermined cycle of the reference frequency following commencement of operation or reset of the PLL circuit as an indication of stabilization of the reference frequency, and means responsive to detection of said selected edge for thereupon linearly boosting the control voltage from an initial level of substantially zero volts to a predetermined pull-up level exceeding the level of control voltage required to achieve said phase locking, whereby to reduce the time interval required for phase locking measured from the indication of stabilization of the reference frequency obtained from detection of said selected edge.

14. The PLL circuit chip of claim 13, wherein the loop filter includes means responsive to the control voltage level reaching said pull-up level for thereupon turning off the start-up circuit, whereby to remove further influence thereof on achieving phase locking of the local clock and reference frequencies.

15. The PLL circuit chip of claim 13, wherein the loop filter includes means responsive to the control voltage level reaching said pull-up level for incremental reduction of the control voltage to said level required to achieve phase locking.

16. The PLL circuit chip of claim 15, wherein the loop filter includes means responsive to the initial incremental reduction of the control voltage after reaching said pull-up level for thereupon turning off the start-up circuit.

17. The PLL circuit chip of claim 15, wherein the loop circuit includes means for returning the level of the control voltage to substantially zero volts when the chip is reset.

18. The PLL circuit chip of claim 16, wherein the loop circuit includes means for maintaining the start-up circuit in an off state until the PLL circuit is reset, and for thereupon enabling the start-up circuit to again detect said selected edge of the predetermined cycle of the reference frequency, whereby to initiate the linear boost of control voltage response by said means responsive to such detection.

19. The PLL circuit chip of claim 13, wherein said selected edge of the reference frequency is within the first four cycles following commencement of operation or reset of the PLL circuit.

* * * * *